United States Patent
Zhang et al.

(10) Patent No.: US 10,090,470 B2
(45) Date of Patent: Oct. 2, 2018

(54) SEMICONDUCTOR FILM AND METHOD OF FORMING THE SAME

(71) Applicant: City University of Hong Kong, Kowloon (HK)

(72) Inventors: Ruiqin Zhang, Kowloon (HK); Juncao Bian, Kowloon (HK)

(73) Assignee: CITY UNIVERSITY OF HONG KONG, Kowloon (HK)

(*) Notice: Subject to any disclaimer, the term of this patent is extended or adjusted under 35 U.S.C. 154(b) by 0 days.

(21) Appl. No.: 15/049,435

(22) Filed: Feb. 22, 2016

(65) Prior Publication Data
US 2017/0244037 A1 Aug. 24, 2017

(51) Int. Cl.
| | |
|---|---|
| H01L 51/40 | (2006.01) |
| H01L 51/00 | (2006.01) |
| H01L 29/12 | (2006.01) |
| H01L 51/44 | (2006.01) |
| H01L 51/52 | (2006.01) |
| H01G 9/20 | (2006.01) |
| C01B 21/06 | (2006.01) |
| C23C 14/12 | (2006.01) |
| H01L 51/42 | (2006.01) |
| H01L 51/50 | (2006.01) |
| C23C 14/24 | (2006.01) |

(52) U.S. Cl.
CPC ...... *H01L 51/0035* (2013.01); *C01B 21/0605* (2013.01); *C23C 14/12* (2013.01); *H01G 9/20* (2013.01); *H01L 51/001* (2013.01); *H01L 51/442* (2013.01); *H01L 51/5206* (2013.01); *H01L 51/5234* (2013.01); *C23C 14/24* (2013.01); *H01L 51/42* (2013.01); *H01L 51/5012* (2013.01); *H01L 2251/306* (2013.01); *H01L 2251/308* (2013.01); *H01L 2251/558* (2013.01)

(58) Field of Classification Search
CPC .... C23C 14/24; H01L 51/0035; H01L 51/001
USPC .............. 257/40, 613, E21.09; 438/99
See application file for complete search history.

(56) References Cited

U.S. PATENT DOCUMENTS

| | | | |
|---|---|---|---|
| 2005/0093108 A1* | 5/2005 | Chang | G02B 6/3584 257/635 |
| 2006/0198946 A1* | 9/2006 | Tan | C23C 14/12 427/66 |

(Continued)

OTHER PUBLICATIONS

Jianjun Wang, Dale R Miller, Edward G Gillan, Deposition of carbon nitride films from single-source s-triazine precursors, Carbon, vol. 41, Issue 11, 2003, pp. 2031-2037, ISSN 0008-6223.*

(Continued)

*Primary Examiner* — Fernando L Toledo
*Assistant Examiner* — Aaron Gray
(74) *Attorney, Agent, or Firm* — Renner Kenner Greive Bobak Taylor & Weber

(57) ABSTRACT

A method of forming a semiconductor film at pressure between $10^{-5}$ atm and 10 atm in the presence of a substrate includes (i) providing a precursor material in a reaction container; (ii) arranging the substrate on the reaction container such that a conductive surface of the substrate is facing towards the precursor material; and (iii) conducting a heat treatment to deposit a semiconductor layer on the conductive surface of the substrate. A semiconductor film is obtained from this method and a device comprising such semiconductor film is also provided.

9 Claims, 16 Drawing Sheets

(56) References Cited

U.S. PATENT DOCUMENTS

| | | | |
|---|---|---|---|
| 2009/0176036 A1* | 7/2009 | Matsumoto | C23C 14/12 427/596 |
| 2013/0160712 A1* | 6/2013 | Niboshi | C23C 14/12 118/726 |
| 2015/0352539 A1* | 12/2015 | Miyajima | B01J 27/24 204/157.52 |

OTHER PUBLICATIONS

Roberto C. Dante, Pablo Martin-Ramos, Adriana Correa-Guimaraes, Jesus Martin-Gil; "Synthesis of graphitic carbon nitride by reaction of melamine and uric acid Synthesis of graphitic carbon nitride by reaction of melamine and uric acid"; Materials Chemistry and Physics, 130 (2011) 1094-1102.*

X. Wang, K. Maeda, A. Thomas, K. Takanabe, G. Xin, J. M. Carlsson, K. Domen, and M. Antonietti, "A metal-free polymeric photocatalyst for hydrogen production from water under visible light", Nature Materials, vol. 8, Jan. 2009, pp. 76-80.

Y. Wang, X. Wang, and M. Antonietti, "Polymeric Graphitic Nitride as a Heterogeneous Organocatalyst: From Photochemistry to Multipurpose Catalysis to Sustainable Chemistry", Angew. Chem. Int. Ed. vol. 51, 2012, pp. 68-89.

X. Zhang, X. Xie, H. Wang, J. Zhang, B. Pan, and Y. Xie, "Enhanced Photoresponsive Ultrathin Graphitic-Phase C3N4 Nanosheets for Bioimaging", Journal of the American Chemical Society, vol. 135, 2013, pp. 18-21.

J. Hong, X. Xia, Y. Wang, and R. Xu, "Mesoporous carbon nitride with in situ sulfur doping for enhanced photocatalytic hydrogen evolution from water under visible light", Journal of Materials Chemistry, vol. 22, 2012, pp. 15006-15012.

* cited by examiner

*Prior Art*

SEMICONDUCTOR FILM AND METHOD OF FORMING THE SAME

TECHNICAL FIELD

The present invention relates to a method of forming a semiconductor film in the presence of a substrate, in particular but not exclusively a semiconductor thin film, and the semiconductor film obtained from said method. The invention further refers to a device comprising said semiconductor film.

BACKGROUND

Whilst most of semiconductor thin films are prepared from inorganic materials containing metals, progress has also been made in developing organic semiconductor thin films. Currently, conventional approaches for making organic semiconductor films include spin-coating, drop casting, doctor blading and vacuum thermal evaporation. However, there are several drawbacks associated with the above processes, for example, formation of pinholes in the film, poor uniformity, low production rates or low conductivity.

To date, graphitic carbon nitride (g-CN), the most stable allotrope of carbon nitride, has emerged as a promising material for manufacturing optoelectronic devices owing to its electronic structure and photoelectronic properties. It may be applied as a photocatalyst for fuel conversion, degradation of organic pollutants, bio-imaging, and sensing. However, most of the current methods for preparing g-CN films are still at the preliminary stage and far from satisfactory. In particular, the g-CN films are mainly prepared from g-CN powders which are usually obtained from thermal condensation of organics (e.g. urea, melamine, and thiourea) under vacuum condition. The powders obtained are subsequently subjected to direct depositions including drop casting and spin coating. However, these approaches fail to fabricate g-CN films with good uniformity, conductivity and stability.

Most recently, a thermal condensation method of depositing the g-CN nanostructures by placing precursors between two substrates or on a substrate has been reported (M. Shalom, S. Gimenez, F. Schipper, I. Herraiz-Cardona, J. Bisquert, M. Antonietti, Angew. Chem. Int. Ed. 2014, 53, 3654-3658; Angew. Chem. 2014, 126, 3728-3732; J. Xu, T. J. K. Brenner, L. Chabanne, D. Neher, M. Antonietti, M. Shalom, J. Am. Chem. Soc. 2014, 136, 13486-13489). However, the high process temperature strengthens the adhesion force of the powder on the surface, making it difficult to be cleaned out and resulting in non-uniform films (as shown in FIG. 1).

Accordingly, there remains a strong need for developing an effective method to prepare a semiconductor film, especially for metal-free semiconductor thin film, with good uniformity and conductivity. The method should also allow for adjustment of the surface morphology, thickness and size of the film.

SUMMARY OF THE INVENTION

In accordance with a first aspect of the present invention, there is provided a method of forming a semiconductor film at pressure between $10^{-5}$ atm and 10 atm in the presence of a substrate, comprising steps of:
(i) providing a precursor material in a reaction container;
(ii) arranging the substrate on the reaction container such that a conductive surface of the substrate is facing towards the precursor material; and
(iii) conducting a heat treatment to deposit a semiconductor layer on the conductive surface of the substrate.

In one embodiment of the first aspect, the precursor material is in the form of powder.

In one embodiment of the first aspect, the precursor material is an organic material.

In one embodiment of the first aspect, step (iii) is carried out by heating the precursor material with a temperature at or above a melting point or a sublimation point of the precursor material for a predetermined period of time.

In one embodiment of the first aspect, step (iii) is carried out with a predetermined heating rate of about 0.1-100° C./min and a predetermined cooling rate of about 0.1-100° C./min.

In one embodiment of the first aspect, step (iii) is carried out by heating the precursor material with a temperature above the sublimation point of the precursor material, in which the precursor material forms vapors and the vapors saturate the reaction container.

In one embodiment of the first aspect, step (iii) further includes a condensing step of condensing the vapors on the conductive surface of the substrate.

In one embodiment of the first aspect, the precursor material has a sublimation point of about 0° C. to about 600° C.

In one embodiment of the first aspect, the precursor material consists of melamine.

In one embodiment of the first aspect, the semiconductor film comprises graphitic carbon nitride.

In one embodiment of the first aspect, the substrate is selected from the group consisting of fluorine doped tin oxide coated glass, indium tin oxide coated glass and silicon.

In accordance with a second aspect of the present invention, there is provided a semiconductor film obtainable from the first aspect of the invention.

In one embodiment of the second aspect, the semiconductor film comprises an organic material.

In one embodiment of the second aspect, the semiconductor film comprises graphitic carbon nitride.

In one embodiment of the second aspect, the semiconductor film has a thickness of around 0.1 nm to 500 μm.

In one embodiment of the second aspect, the semiconductor film has a thickness of around 0.1 nm to 100 μm.

In accordance with a third aspect of the present invention, there is provided a device comprising the semiconductor film obtained from the first aspect of the invention.

In one embodiment of the third aspect, the device is a photoelectrochemical device or an optoelectronic device.

DETAILED DESCRIPTION OF THE INVENTION

Figure 1:
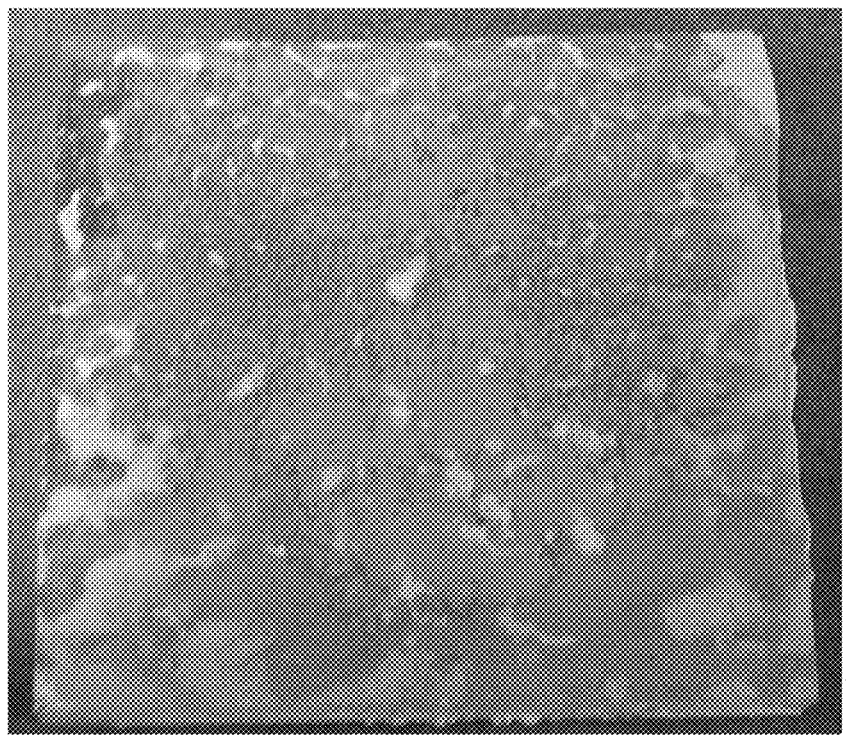
FIG. 1 is a photo of a g-CN film obtained from prior art.

The present invention refers in a first aspect to a method of forming a semiconductor film at pressure between $10^{-5}$ atm and 10 atm in the presence of a substrate. Said method comprises steps of:

(i) providing a precursor material in a reaction container;
(ii) arranging the substrate on the reaction container such that a conductive surface of the substrate is facing towards the precursor material; and
(iii) conducting a heat treatment to deposit a semiconductor film on the conductive surface of the substrate.

The term "semiconductor" is known to the skilled person and refers to a material having electrical conductivity greater than insulators but less than good conductors. In particular, the conducting properties of semiconductor may be altered according to the conditions such as doping and stimulation by light or heat. For example, the resistance of the semiconductor decreases when its temperature increases, i.e. the conductivity increases. Further increase the temperature can increase the resistance and decrease the conductivity.

Preferably, the semiconductor film obtained from the present invention comprises an organic material, more preferably consists of organic material. In some preferred embodiments, the organic material comprises or consists of graphitic carbon nitride.

The term "thin film" in the present invention refers to a layer of material having a thickness of about 0.1 nm to about 500 μm, preferably of about 1 nm to about 100 μm, more preferably of about 1 nm to 50 μm, further preferably of about 1 nm to 10 μm, and most preferably about 1 nm to 5 μm. The skilled person is aware of suitable methods for determining the thickness of the film such as scanning electron microscope (SEM) and atomic force microscopy (AFM).

The term "conductive" as used herein refers to electric conductivity. Preferably, the substrate used in the present invention is electrically conductive, or at least has a conductive surface. More preferably, the substrate is selected form the group consisting of fluorine doped tin oxide coated glass (FTO glass), indium tin oxide coated glass (ITO glass), and silicon. Most preferably, the substrate is FTO glass.

The term "precursor material" as used herein refers to a material that reacts to produce a target substance, i.e. the semiconductor film in the present invention. In preferred embodiments, the precursor material is in the form of solid and preferably as powders. Preferably, the precursor material is an organic material. In some preferred embodiments, the precursor material can be a material that sublimes directly from a solid phase to a gas phase when heating with a temperature at or above its sublimation point.

The skilled person is aware of suitable methods of determining the desired thickness and size of the semiconductor film. It generally depends on the amounts of precursor material applied in the method for forming the semiconductor film.

"Sublimation point" in the present invention refers to a temperature that a solid substance begins to change from a solid phase to a gas phase at atmospheric pressure without passing through an intermediate liquid phase. Generally, sublimation is an endothermic phase transition that occurs at temperatures and pressure below a substance's triplet point. Substances such as carbon and arsenic are known to have a sublimation point and their liquid state can be hardly obtained. In preferred embodiments, the precursor material having a sublimation point is heated with a temperature higher than its sublimation point for reaction. Said precursor material can then sublime and saturate the reaction container with vapors under sufficient supply of heat energy. Preferably, the precursor material has a sublimation point of about 0° C. to about 600° C., more preferably about 100° C. to about 400° C., further preferably about 300° C. to about 400° C. In most preferred embodiments, the precursor material comprises or consists of melamine. I.e. melamine is a precursor material for forming a semiconductor film having graphitic carbon nitride and has a sublimation point of above 300° C., i.e. around 340° C. to 350° C.

The term "melting point" refers to a temperature that a solid substance begins to change from a solid phase to a liquid phase at atmospheric pressure, in particular at standard atmospheric pressure. The skilled person is aware of suitable methods for determining the sublimation point and melting point of a substance.

The method of the present invention is conducted at pressure between $10^{-5}$ atm and 10 atm. Preferably, the method is conducted at atmospheric pressure, the term "atmospheric pressure" as used herein refers to an ambient pressure, which is the pressure of the surrounding air. It may vary in accordance with temperature and altitude at a given location. Generally, the atmospheric pressure is around 1±0.1 atm or 760±76 mm Hg (torr) at sea level.

The method of the present invention is advantageous in that it allows for formation of a semiconductor film under the atmospheric pressure, i.e. without vacuum. It is cost effective and simple. The manufacturing costs can be substantially reduced without the use of a vacuum system. It will be appreciated by persons skilled in the art that the method also works well at pressure between $10^{-5}$ atm and 10 atm.

In preferred embodiments, step (iii) of the method is carried out by heating the precursor material with a temperature at or above a melting point or a sublimation point, more preferably above a sublimation point, of the precursor material, for a predetermined period of time. The predetermined period of time allows the precursor material to vaporize or sublime to create a saturated vapor pressure in the reaction container. For example, in some embodiments, the predetermined period of time may be 1 hr; in other embodiments, the predetermined period of time may be more than 2 hr. It is appreciated that the predetermined period of time may be based on the amount of the precursor material and the skilled person is capable of determining appropriate predetermined period of time for the heat treatment. The vapor pressure, also referred as sublimation pressure, generally refers to a pressure exerted by a vapor in a closed system at a given temperature.

In some embodiments, the precursor material is heated with a temperature of less than 1000° C., preferably in a range of about 300° C. to about 800° C., preferably about 300° C. to about 600° C., more preferably about 350° C. to about 550° C., and further preferably about 450° C. to about 500° C.

Further preferably, step (iii) further includes a condensing step of condensing the vapors on the conductive surface of the substrate.

In case that the precursor material comprises or consists of melamine, the precursor material is preferably heated at a temperature at or above 450° C. to 500° C. for at least 2 hr under the atmospheric pressure. As such, the melamine which has a sublimation point of around 340° C. to 350° C. can essentially or completely sublimes in the reaction container to form vapors. The elevated temperature further assists the condensation of the vapors on the conductive surface of the substrate.

Step (iii) is carried out with a predetermined heating rate and a predetermined cooling rate. Preferably, the predetermined heating rate is about 0.1-100° C./min and the predetermined cooling rate is about 0.1-100° C./min, more preferably, the predetermined heating rate is about 2-10° C./min and the predetermined cooling rate of is about 0.1-10° C./min, further preferably, the predetermined heating rate and cooling rate are 2-5° C./min, and still further preferably the predetermined heating rate and cooling rate are 3° C./min. The gradual increase and decrease of temperature is advantageous in that it facilitates formation of a uniform film and reduces the formation of holes in the film. Formation of holes in the film is detrimental as it would significantly affect the conductivity and photo-luminescent properties of the film.

In one aspect, the present invention refers to a semiconductor film obtained from the method as described herein. The semiconductor film is preferably comprises organic material and is metal-free. More preferably, the semiconductor film comprises graphitic carbon nitride, and most preferably consists of graphitic carbon nitride.

The present invention in a further aspect refers to a device comprising said semiconductor film. The device includes a photoelectrochemical device and an optoelectronic device. The optoelectronic device further includes a light emitting device, a photocatalytic device and a photovoltaic device. In preferred embodiments, semiconductor films having graphitic carbon nitride may be used as photoelectrodes for hydrogen production via water splitting under solar light. In particular, one preferred embodiment of g-CN film prepared according to said method can be applied as a photocatalyst for solar fuel conversion and pollutant degradation due to its moderate band gap of 2.7 eV, good chemical stability under light irradiation, low cost and non-toxicity.

The examples set out below further illustrate the present invention. The preferred embodiments described above and the drawings as well as examples given below represent preferred or exemplary embodiments and a skilled person will understand that the reference to those embodiments or examples is not intended to be limiting.

Example 1

Synthesis of g-CN Films

Figure 2:
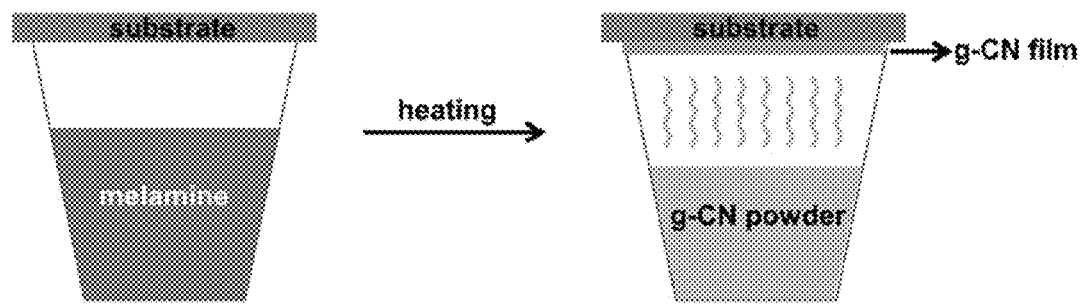
FIG. 2 is a schematic diagram illustrating one embodiment of the present invention.

FIG. 2 illustrates a preferred embodiment of the method of the present invention. The method was performed at atmospheric pressure.

A ceramic crucible was used as the reaction container. The top of the ceramic crucible was polished with a piece of abrasive paper before use. In the synthesis process, 10 g of melamine (Acros) was placed into a ceramic crucible (25 mL) and a substrate FTO glass (50 mm×50 mm×3.2 mm; Zhuhai Kavi, Co. Ltd.) was placed on the crucible to create a closed system for reaction. In addition, 50 g of melamine were used for 200 mL ceramic crucibles for preparing films with a larger dimension. The amount of the precursor and the diameter of the crucible as well as its volume can be changed to tune the diameter and thickness of the g-CN film.

The crucible was then subjected to a heat treatment, also referred as thermal vapor condensation, in a muffle furnace (Carbolite) that was placed in a fumehood at atmospheric pressure, and was kept at 500° C. for 3 h with heating and cooling rates of 3° C./min.

Figure 3:
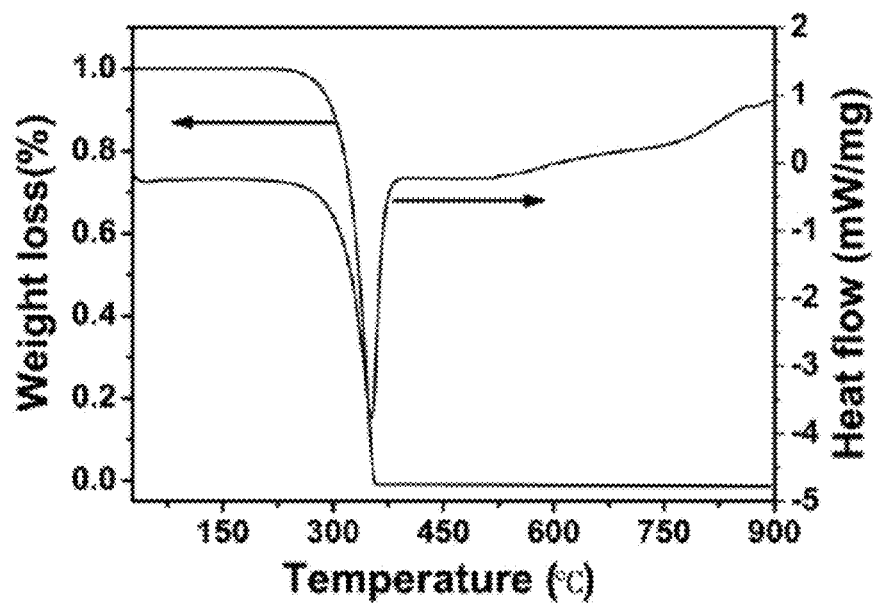
FIG. 3 is a TG-DSC thermograms of melamine present in one embodiment of the present invention.

During the heat treatment, melamine was reacted to form g-CN powders and grow g-CN films. A strong endothermal peak was found at 352° C. and the sample weight decreased quickly upon further heating, as can be seen from the TG-DSC measurements (see FIG. 3). The g-CN powders sublimed to form vapors inside the crucible at the sublimation point. With the gradual increase of the temperature, the total pressure in the reaction container reached a saturation limit and the vapors started to condense and deposit on the conductive surface of the FTO glass. In particular, nucleation and growth of g-CN film were performed on the conductive surface.

Figure 4:
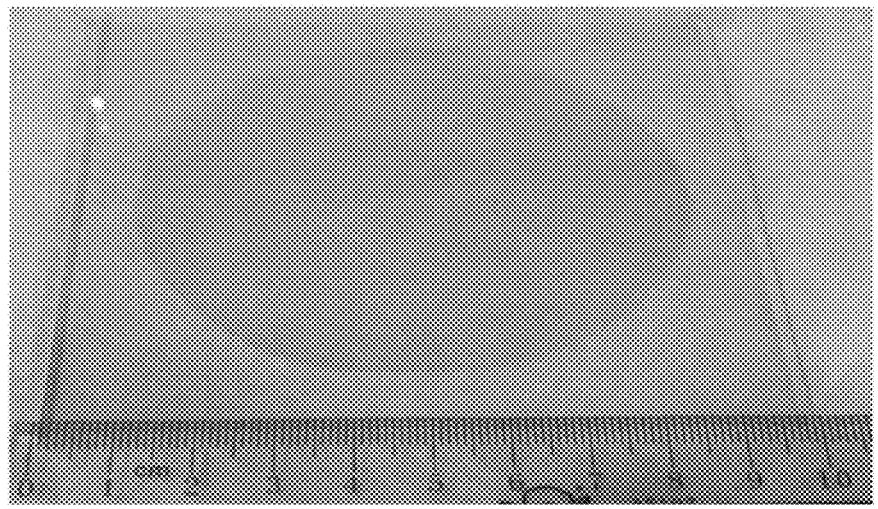
FIG. 4 is a photo of a g-CN film obtained from one embodiment of the present invention.

Finally, a g-CN film with a diameter of 8 cm was deposited on the surface of FTO glass (see FIG. 4). The threshold temperature for the formation of a film from melamine vapor was 470° C. By tuning the mass of the precursor and the volume and diameter of the crucible, pinhole-free g-CN films with even larger surface areas can be deposited.

Additional g-CN films were prepared by replacing FTO glass with ITO glass (Zhuhai Kavi, Co. Ltd.), quartz glass (Jiangsu Jinghe Co. Ltd) and silica respectively.

Example 2

Determination of Physicochemical and Electrochemical Characteristics of g-CN Films All the following measurements were carried out at room temperature.

Example 2A

Characterization of g-CN Films

Thermogravimetric differential scanning calorimetry analysis (TGDSC) of melamine was performed on a TA DSC Q20. The surface morphology of the films was investigated by the Quanta F400 85 field emission scanning electron microscope (FE-SEM). The atomic force microscope (AFM) images were obtained on an AFM (VEECO Multimode V) with a nanoscope V controller. The XRD patterns were measured on a Philips powder diffractometer using Cu $K_\alpha$ radiation ($\lambda$=1.5406 Å).

All geometric structure optimizations for the ground state were performed based on a self-consistent-charge density-functional tight-binding (SCC-DFTB) method (B. Aradi, B. Hourahine, T. Frauenheim, J. Phys. Chem. A 2007, 111, 5678-5684.) with the DFTB+ code. The SCC-DFTB approach is an approximate DFT scheme, which is derived from a second-order expansion of the Kohn-Sham total energy in DFT with respect to charge density fluctuations.

The Hamiltonian matrix elements were calculated with a two-center approximation, which were tabulated together with the overlap matrix elements as a function of the interatomic distance. The SCC-DFTB has been proven to be computationally efficient and reliable in the simulation of large systems.

Figure 5:
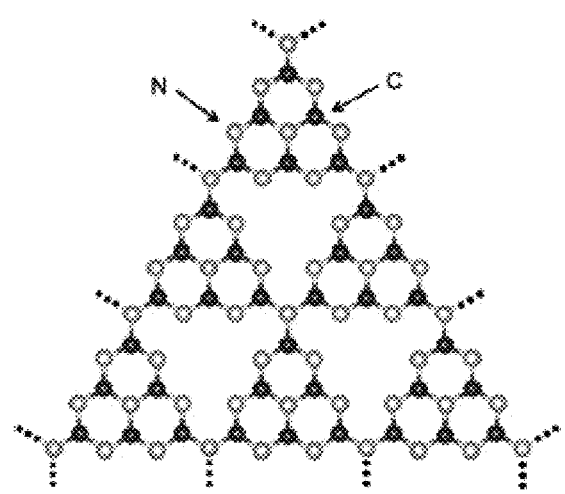
FIG. 5 is a schematic illustration of the tri-s-triazine structure of g-CN, wherein the black and gray spheres represent C and N atoms respectively.
Figure 6:
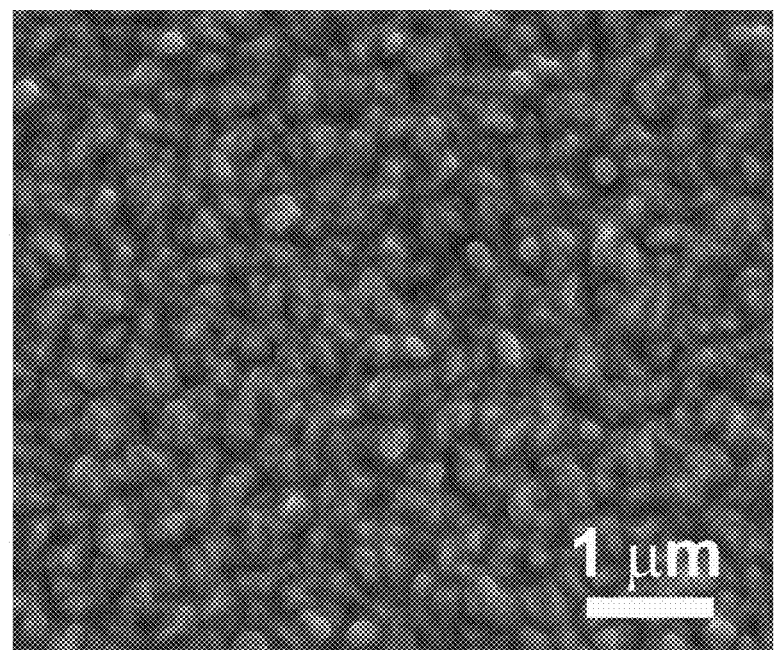
FIG. 6 shows a SEM image of a g-CN film on FTO glass obtained from one embodiment of the present invention.
Figure 7:
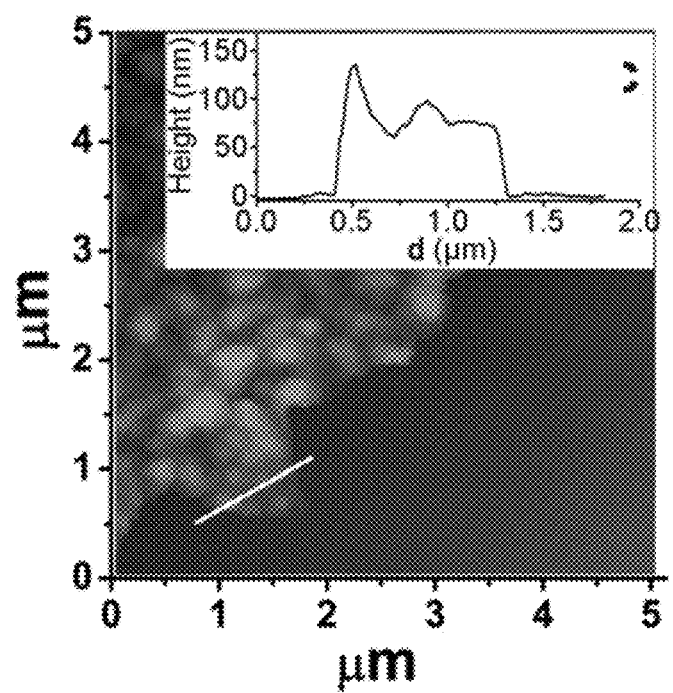
FIG. 7 is an AFM image of a g-CN film transferred onto mica, in which the inset shows the height profile measured along the white line shown in the AFM image.

The graphitic plane of g-CN composed of tri-s-triazine units is shown in FIG. 5. The SEM images of the g-CN film in FIG. 6 illustrates the quality of the large-area and pinhole-free film. The corrugated surface results from the attachment of a thin film on the surface of the textured FTO, which makes it difficult to characterize the thickness of the g-CN film by using SEM. For the respective AFM measurements (FIG. 7), a g-CN film was transferred to the surface of a mica sheet.

Figure 8:
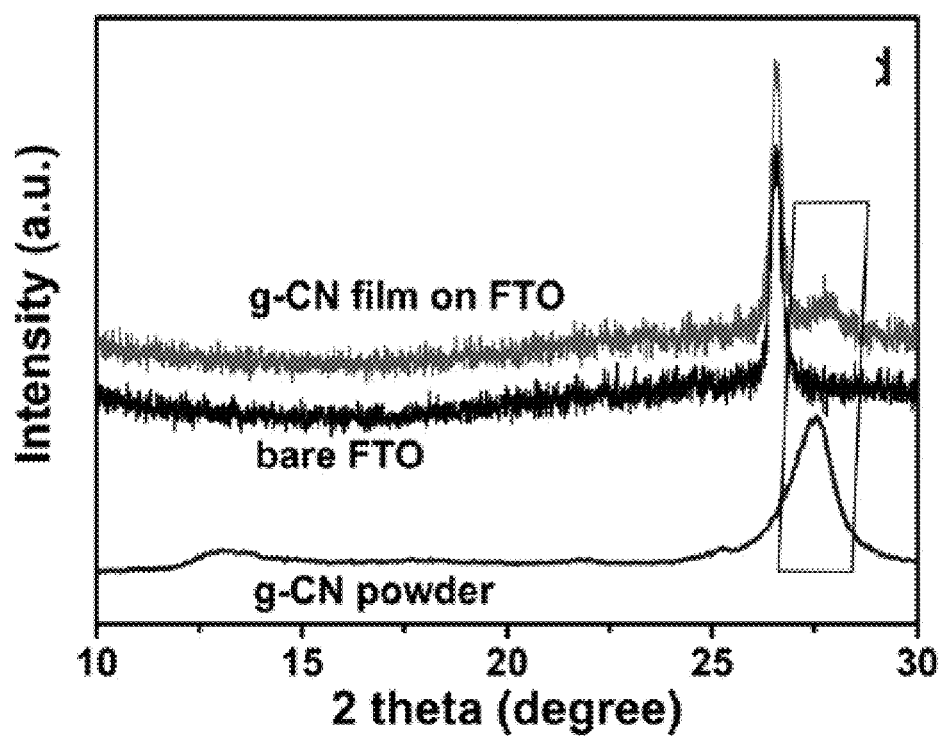
FIG. 8 shows XRD patterns of a g-CN film on FTO glass, compared with those of bare FTO and g-CN powder, wherein diffraction peaks of g-CN at 27.8° are highlighted by a rectangle.

By measuring ten different regions of the film, the thickness of the film was determined to be 72±10 nm. The XRD pattern of the g-CN film (FIG. 8) shows a broad peak at 27.8°, which is similar to that of g-CN powder and is assigned to interlayer stacking of the tri-s-triazine units. The intensity of the peak at 27.8° is weaker for the g-CN film than for g-CN powder; this is attributed to the thinness of the film. The other characteristic diffraction signal at 13.1° was too weak to be detected.

Example 2B

Absorption Spectra of the g-CN Films

Fourier transform infrared (FTIR) spectra were recorded on an FTIR spectrometer (PerkinElmer Spectrum 100). The UV/Vis absorption spectra of thin g-CN films were obtained on a Varian 50 Conc UV/Vis spectrophotometer. The UV/Vis diffuse reflectance absorption spectra of g-CN powders and g-CN films with the thickness larger than 500 nm were recorded on a UV/Vis-NIR (UV 3600, Shimadzu) spectrophotometer equipped with an integrating sphere.

A time-dependent density-functional-based tight-binding method (TD-DFTB) has been applied to calculate the adsorption spectrum (T. Niehaus, S. Suhai, F. Della Sala, P. Lugli, M. Elstner, G. Seifert, T. Frauenheim, Phys. Rev. B 2001, 63, 085108.). This method provides excitation energies of lowlying valence states with an accuracy close to full TDDFT calculations at a highly reduced numerical cost. All IR spectrum calculations were performed using the B3LPY method (C. Lee, W. Yang, P. G. Robert, Phys. Rev. B 1988, 37, 785-789; A. D. Becke, J. Chem. Phys. 1993, 98, 5648-5652.) and the 6-311 (R. Krishnan, J. S. Binkley, R. Seeger, J. A. Pople, J. Chem. Phys. 1980, 72, 650-654.) basis set implemented in the Gaussian '09 suite of programs (Gaussian 09 (revision A.02), 2009). The vibrational frequencies were scaled by a factor of 0.97 to facilitate the comparison with FTIR spectrum.

Figure 9:
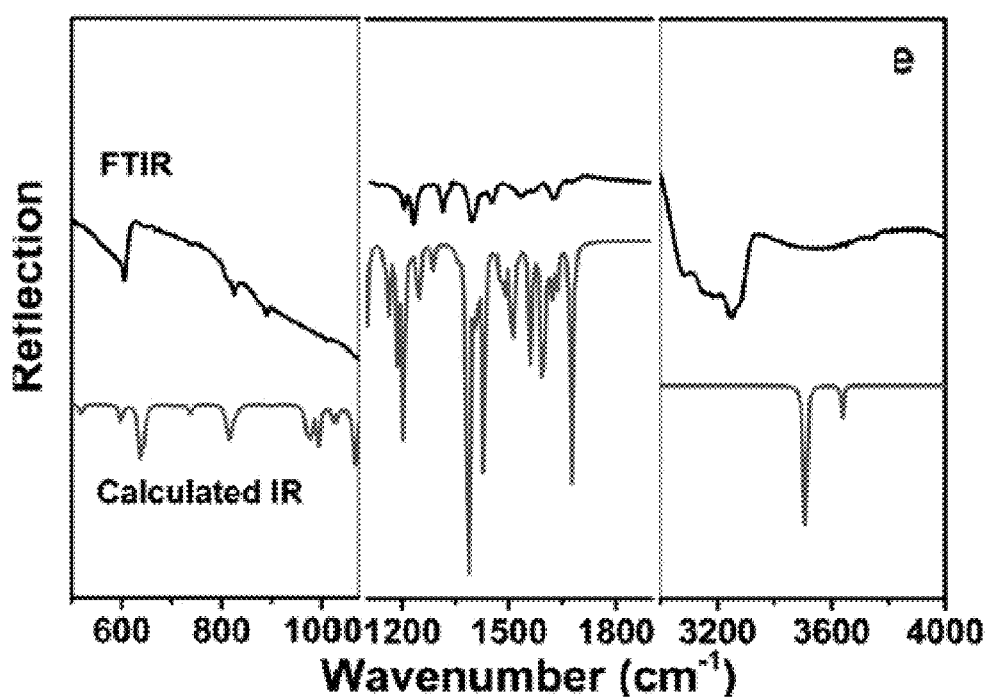
FIG. 9 shows the FTIR spectrum of the g-CN film, which is compared with the calculated IR spectrum of six triangle-arranged tri-s-triazine sheets.
Figure 10:
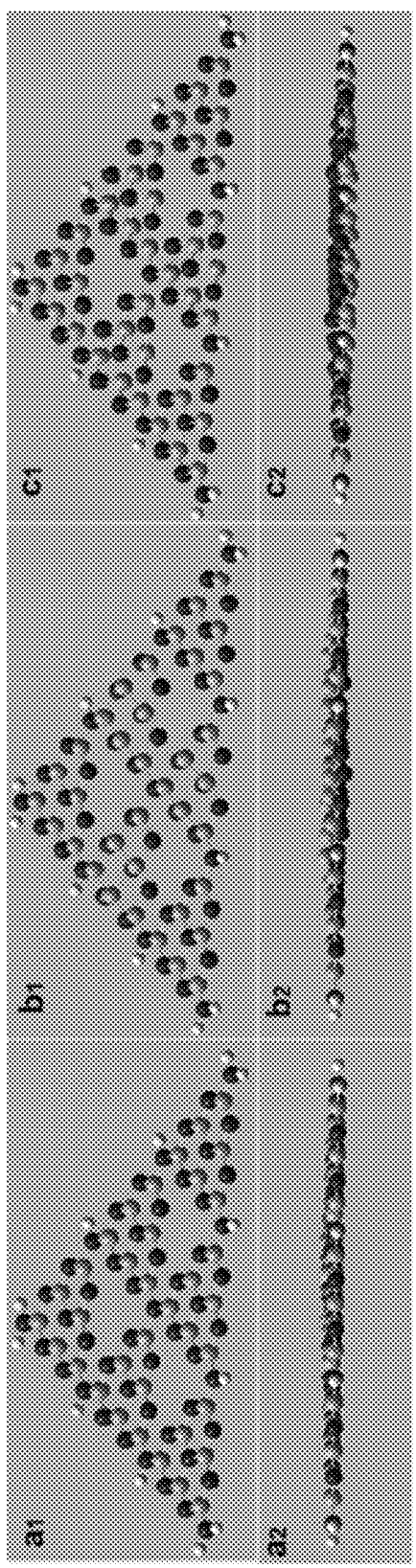
FIG. 10 shows the collective IR wagging mode at 818 $cm^{-1}$ of C and N atoms in the tri-s-triazine units, seen from different angles, in which a1 and a2 represent steady state; and b1, b2, c1, c2 represent transient vibration states.
Figure 11:
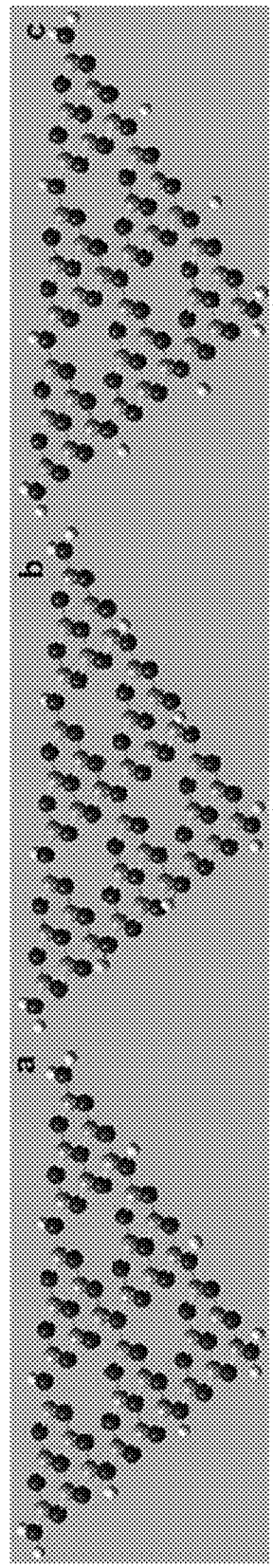
FIG. 11 shows the IR stretching mode at 637 $cm^{-1}$ of H atoms at NH— for bridging the tri-s-triazine units, in which (a) represents steady state; and b, c represent transient vibration states.

Formation of g-CN with tri-s-triazine units is given by the FTIR and calculated IR spectra shown in FIG. 9. The interactions of the interlayer tri-s-triazine-based structures led to a shift in vibration peaks. The characteristic vibration modes in 1100-1800 $cm^{-1}$ region are the complex stretching modes of the tri-s-triazine units. The peak at 823 $cm^{-1}$ in the FTIR spectrum corresponds to the calculated peak at 818 $cm^{-1}$, which is the collective wagging mode of C and N atoms in tri-s-triazine units (see FIG. 10). In the FTIR spectrum, the peak at 605 $cm^{-1}$, corresponding to the calculated peak at 637 $cm^{-1}$, is the wagging mode of H atoms in the —N—H group that bridges the tri-s-triazine units (see FIG. 11). The calculated peaks centered at 3506 and 3637 $cm^{-1}$ are stretching modes of the uncondensed —N—$H_2$ group at the edge of the sheet.

The as-deposited g-CN films on FTO glass show a strong optical absorption (FIG. 12) in the UV region with a high energy peak at 307 nm and a broad tail with two peaks at 366 and 386 nm extending to the visible region; this compares well with the absorption spectrum of the film grown on silica. The oscillation of the absorption curve at wavelengths longer than 420 nm is due to the interference of light.

Figure 12:
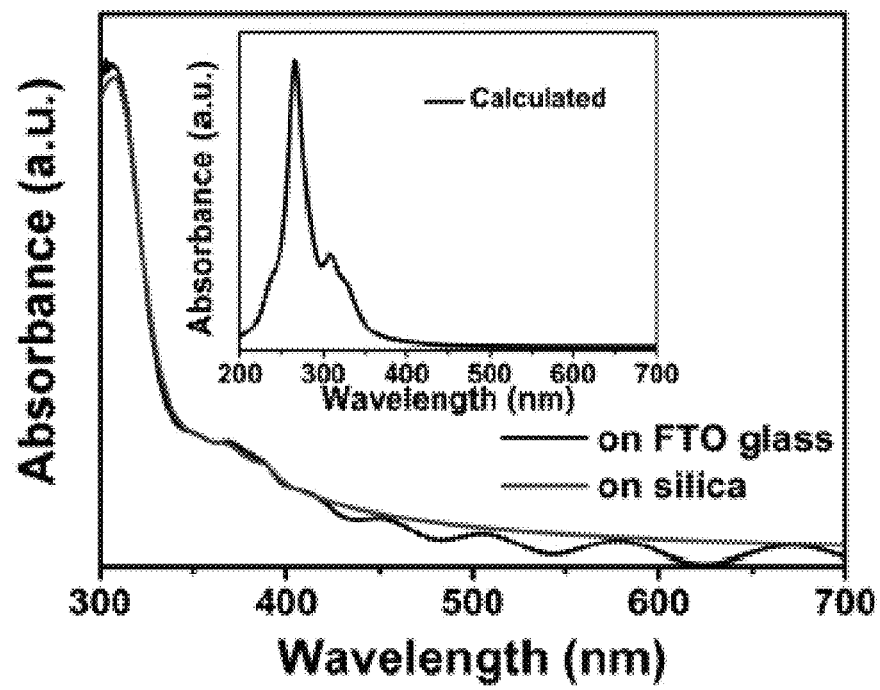
FIG. 12 shows the absorption spectra of a g-CN film on FTO glass and silica, in which the inset represents theoretical absorption spectrum calculated for the model composed of 10 triangle-arranged tri-s-triazine units.
Figure 13:
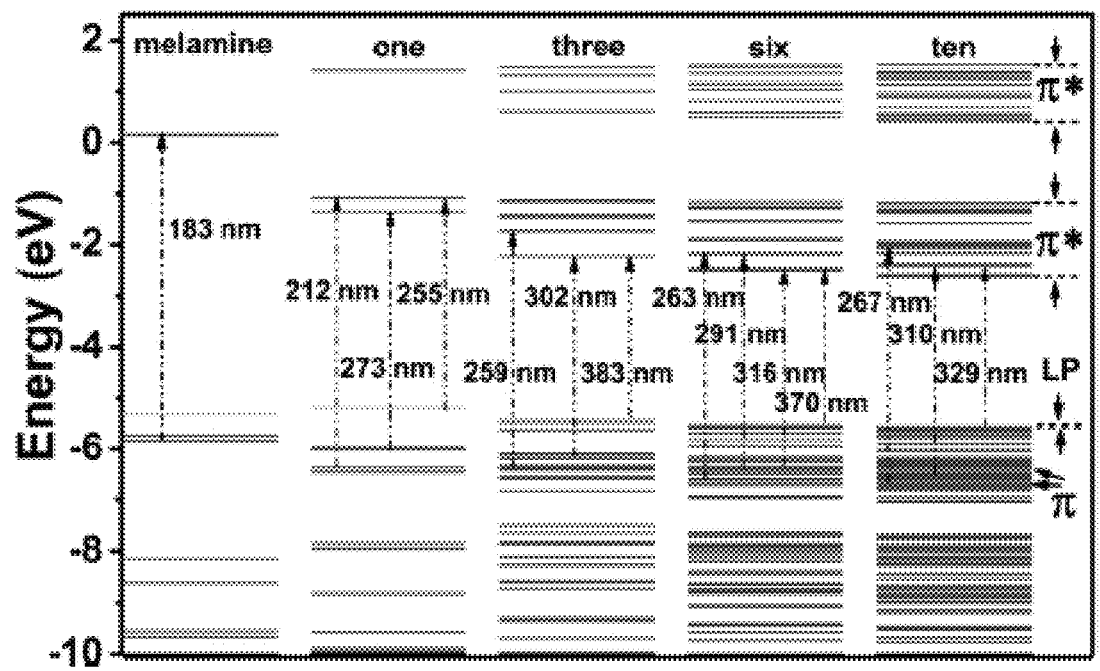
FIG. 13 shows the calculated energy-level diagram for melamine, and the sheets constructed with one, three, six, and ten triangle-arranged tri-s-triazine units.

Further evidence for the formation of a g-CN film composed of tri-s-triazine units is provided by the calculated UV/Vis absorption spectrum shown in the inset of FIG. 12. The calculated absorption spectra of the g-CN microstructure composed of tri-s-triazine units arranged in a triangle pattern have similar absorption peaks as those of g-CN film. Taking into account the number of tri-s-triazine units in one layer and the number of the layers, one would expect the measured peaks to be red shifted compared with the calculated ones. Therefore, absorption peaks at 308, 368, and 388 nm would match calculated peaks at 267, 310, and 329 nm. The calculated energy levels of g-CN structures comprised of different numbers of tri-s-triazine units clarify the origin of the absorption peaks (FIG. 13).

The lowest unoccupied molecular orbital (LUMO) and the highest occupied molecular orbital (HOMO) are π* states and lone pair states (LP), owing to the lone-pair electrons of N atoms, respectively. All of the unoccupied orbitals below 2 eV are in π* states. The energy levels below the LP states are a mixture of π, LP, and σ states (referred to as M states). Increasing the number of the tri-s-triazine units enriches the energy levels of π*, LP, and M states with a stable relative position. The calculated peaks at 267 and 310 nm are ascribed to transitions from π states in M to π* states, and the peak at 329 nm is due to the LP-π* transition (see FIG. 13). Moreover, the σ* states do not contribute to absorption.

Example 2C

Photoluminescence Spectra of the g-CN Films

Photoluminescence (PL) spectra were measured on a FLS920P fluorescence spectrometer (Edinburgh Instrument), equipped with a photomultiplier in a Peltier (air-cooled) housing (R928P, Hamamatsu) with a 450 W xenon arc lamp as the excitation for the steady-state spectra and a picosecond-pulsed diode laser (EPD-405 nm, pulse width: 48.9 ps) or pulsed light-emitting diode (EPLED-320, pulse width: 859.1 ps) for the PL-lifetime (time-correlated single-photon counting; TCSPC) measurements. The absolute PL quantum yields (QYs) were determined by a standard procedure using the same fluorescence spectrometer equipped with an integrating sphere with its inner face coated with BENFLEC (Edinburgh Instrument). The spectral correction curves were provided by Edinburgh Instrument.

Time-Resolved PL Measurements:

The PL decay curves were fitted by a three-exponential function according to Equation (1):

$$I(t) = B_1 e^{-t/\tau_1} + B_2 e^{-t/\tau_2} + B_3 e^{-t/\tau_3}, B_1 + B_2 + B_3 = 1 \quad (1)$$

where $\tau_1$, $\tau_2$ and $\tau_3$ are the decay time constants, and $B_1$, $B_2$ and $B_3$ are the normalized amplitudes of each component.

The intensity-weighted average lifetime ($\tau_{av}$), the mean time decay of PL after the picosecond laser pulse, was calculated according to Equation (2):

$$\tau_{av} = \frac{B_1 \tau_1^2 + B_2 \tau_2^2 + B_3 \tau_3^2}{B_1 \tau_1 + B_2 \tau_2 + B_3 \tau_3} \quad (2)$$

Figure 14:
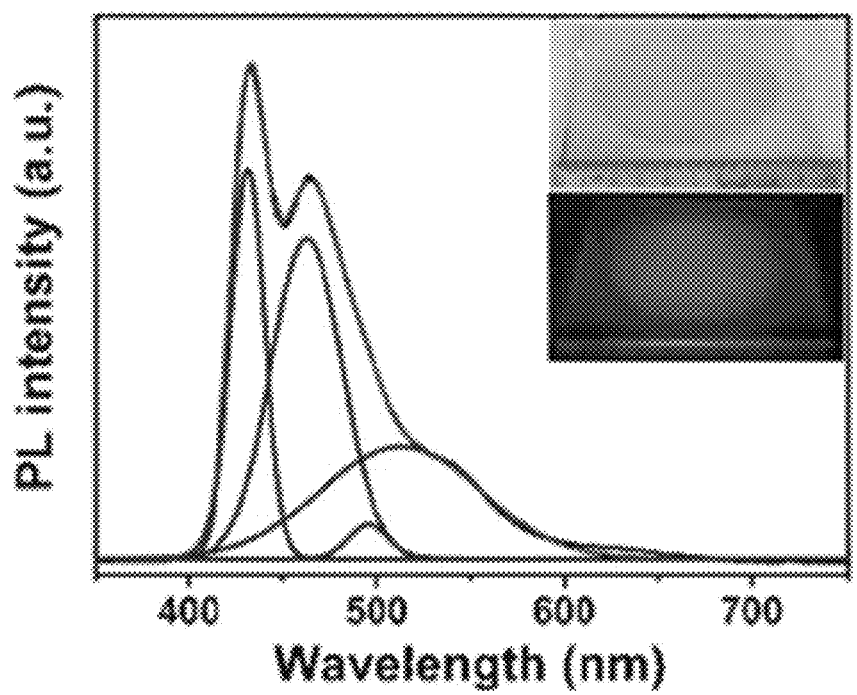
FIG. 14 shows the PL spectrum of a g-CN film grown on FTO glass, in which the insert images are photographs of the g-CN film with a diameter of 8 cm under daylight (upper) and UV-light excitation (lower).
Figure 15:
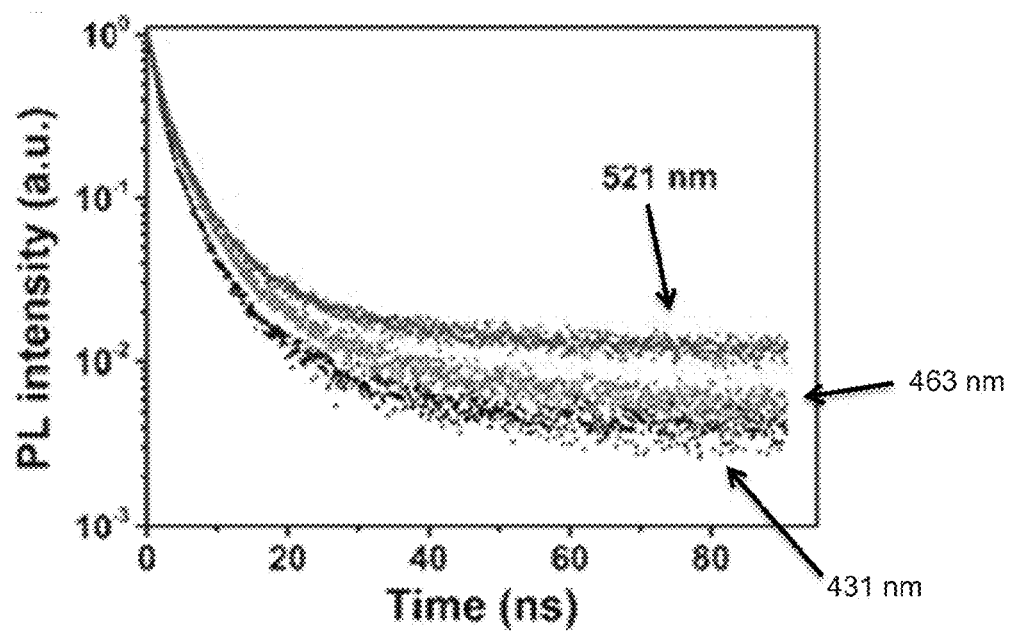
FIG. 15 shows the PL decay curves for different emission peaks of a g-CN film grown on FTO glass.
Figure 16:
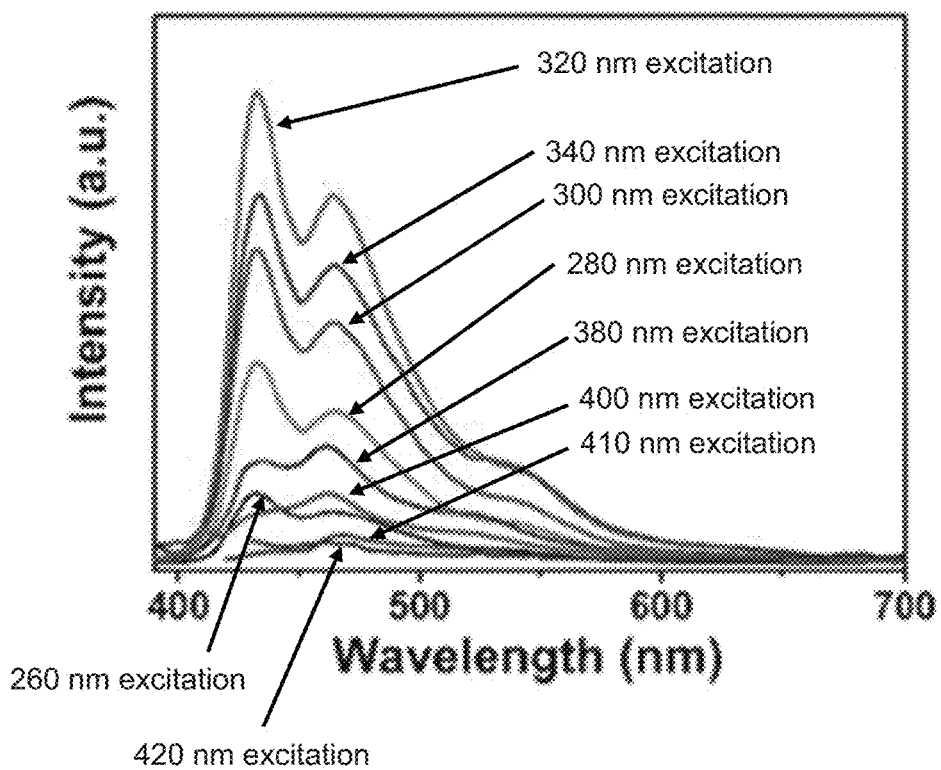
FIG. 16 shows the excitation-wavelength-dependent PL spectra of a g-CN film grown on FTO glass.

Bright blue emission of a g-CN film under UV (365 nm) excitation can be clearly observed in the inset image of FIG. 14. The PL spectrum in FIG. 14 shows the convolution of several emission peaks, which can be fitted by four Gaussian peaks. The absolute PL QY of the film on FTO glass was estimated as 6% by using an integrating sphere. The time-resolved fluorescence decay curves (with an excitation wavelength of 320 nm) of the emission peaks of a g-CN film on the FTO glass at 431 nm, 463 nm, and 521 nm are shown in FIG. 15. An increase in the emission wavelength is accompanied by longer PL lifetime (see Table 1). The longest average PL lifetime for the emission peak at 521 nm is 13 ns, which is still much faster than that of the g-CN powder (106 ns). No difference in PL peaks is observed on changing the excitation wavelength (FIG. 16), demonstrating that electrons excited by light with different wavelengths relax to the same π* state and hop back to the same lower energy levels.

TABLE 1

PL lifetime characteristics of the g-CN films.

| $\lambda_{ex}$ (nm) | PL peak (nm) | $B_1$ (%) | $\tau_1$ (ns) | $B_2$ (%) | $\tau_2$ (ns) | $B_3$ (%) | $\tau_3$ (ns) | $T_{av}$ | $\chi^2$ |
|---|---|---|---|---|---|---|---|---|---|
| 320 nm | 431 | 33.7 | 1.3 | 50.7 | 3.7 | 15.6 | 14.4 | 8.8 | 1.10 |
|  | 436 | 28.8 | 1.5 | 52.3 | 4.1 | 18.9 | 16.8 | 10.9 | 1.19 |
|  | 521 | 39.1 | 1.9 | 44.2 | 5.1 | 16.7 | 20.6 | 13.0 | 1.11 |

Figure 17:
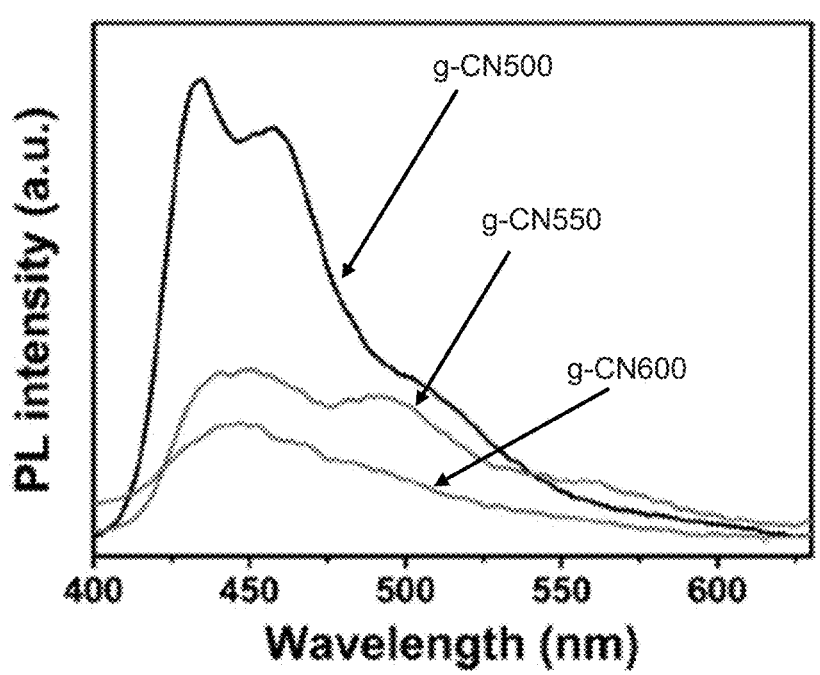
FIG. 17 shows the PL spectra of the g-CN films processed under different temperatures, namely at 500° C., 550° C. and 600° C.

The PL intensity of the g-CN films decreases when the emission peaks redshift with increasing processing temperature (see FIG. 17), which is due to the decreased number of emission centers, because of the enhanced condensation degree of the g-CN films and the enhanced disorder of the microstructure as processing temperature increases. The QYs of the films decrease to 1.7% and 0.4% for g-CN films processed at 550 and 600° C., respectively.

Figure 18:
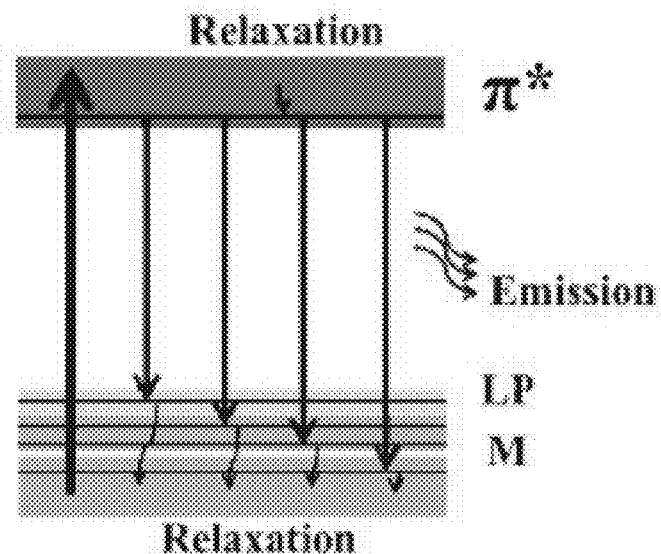
FIG. 18 illustrates the carrier relaxation processes for a g-CN film, wherein M represents the mixed LP, σ, and π states.
Figure 19:
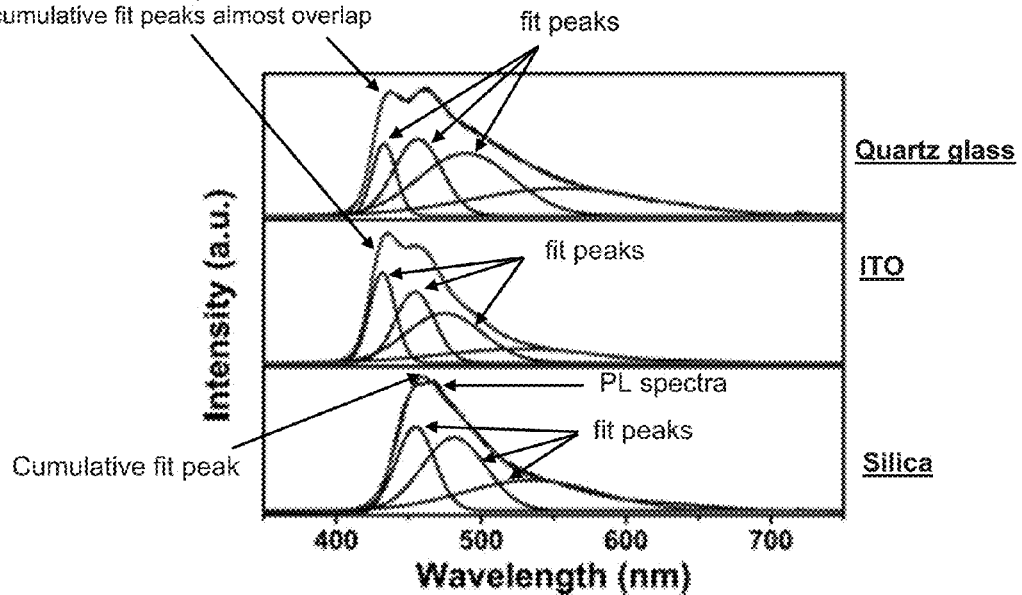
FIG. 19 shows the PL spectra, with the fitted peaks, of the g-CN film grown on the ITO glass, quartz glass and silica (10 g of melamine).

Recent reports proposed that electrons are excited from the σ state to the σ* state and that PL emission results from the transition of electrons from σ* and π* states to the LP state. However, there is still a lack of direct evidence to support this mechanism. Evidenced by inventors' calculations, the transition from the σ state to the σ* state does not happen during the absorption process. Therefore, there is no relationship between the σ-σ* transition and PL emission. Based on the calculated energy-level diagram and the excitation-wavelength-independent PL spectra, a mechanism is proposed to explain PL of g-CN films (FIG. 18). The electrons are excited from π states in M to π* states. After relaxation, the electrons hop back from the π* state (at a lower energy level than the one contributing to the absorption) to LP and M states. Additional relaxation processes occur after radiation recombination at LP and M states. It is possible that the PL peak at 521 nm is due to a π*-LP transition. Another three peaks are ascribed to the transition from π* states to M states. It is a challenge to clarify the accurate transition states in M through theoretical calculations, owing to the existence of electron relaxation in the emission process. g-CN films grown on ITO glass and silica have similar emissions to that grown on FTO glass (see FIG. 19). However, only three peaks can be fitted from the PL spectrum of the film grown on silica (see FIG. 19; positions of the fitted peaks versus the substrates are shown in Table 2). The thicknesses of g-CN films on FTO glass, ITO glass, quartz glass and silica under the same growth parameters are 72±10 nm, 55±2 nm, 60±4 nm, and 1.3±0.2 mm, respectively.

TABLE 2

Fitted emission peaks of the g-CN films formed on different substrates at 500° C.

| Substrate | Peak 1 (nm) | Peak 2 (nm) | Peak 3 (nm) | Peak 4 (nm) |
|---|---|---|---|---|
| FTO glass | 431 | 463 | 496 | 514 |
| ITO glass | 432 | 454 | 475 | 530 |
| Silica | 433 | 456 | 490 | 556 |
| Quartz glass | N/A | 455 | 482 | 536 |

Figure 21:
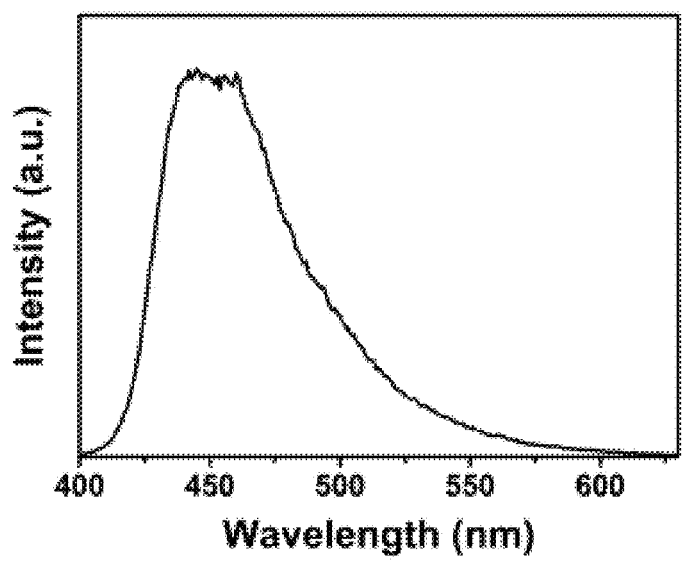
FIG. 21 shows the PL spectrum of the g-CN powder synthesized at 500° C.

The PL spectrum of g-CN can be influenced by the size of the grains and the thickness of the film, owing to the complexity of the energy levels. For the g-CN film on quartz glass, the large film thickness may lead to overlap of nearby energy levels, resulting in grouping of the split M states (FIG. 13), and thus, the disappearance of the emission peak at around 431 nm. Hence, the film on quartz glass shows a similar PL spectrum to g-CN powder (see FIG. 21).

Figure 20:
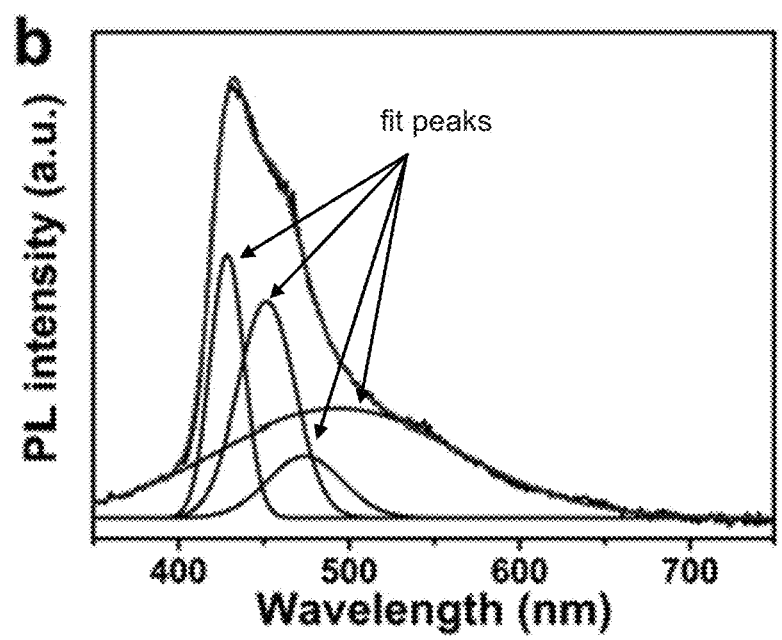
FIG. 20 shows the PL spectrum, with the fitted peaks, of the g-CN film grown on quartz glass (2 g melamine).
Figure 22:
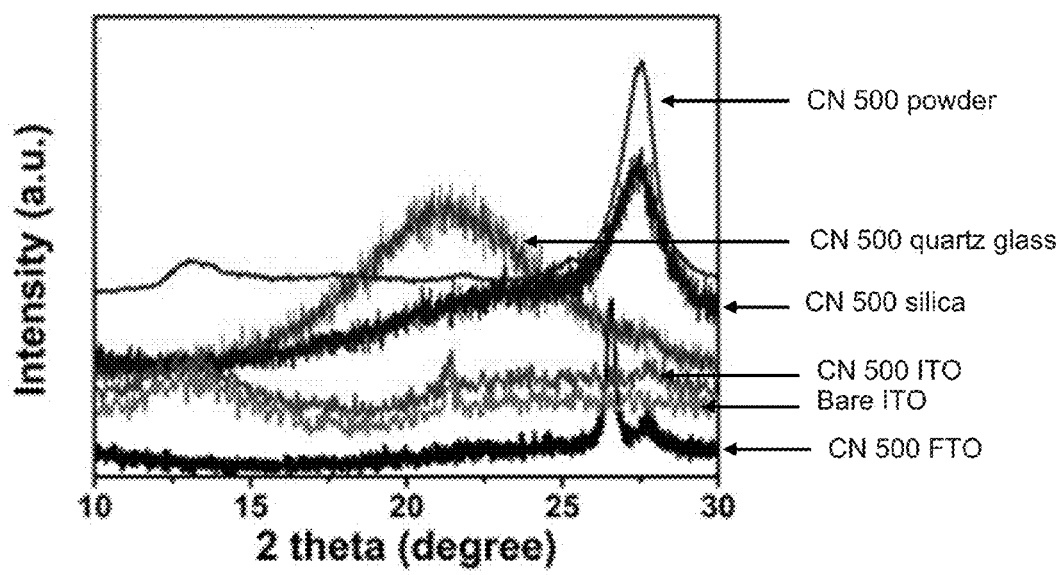
FIG. 22 shows the XRD patterns of the g-CN films deposited on different substrates, namely FTO glass, ITO glass, quartz glass, silica, bare ITO as well as XRD patterns of the g-CN powders.

Four Gaussian peaks can be fitted from the PL spectrum of the film on silica with a thickness of 535 nm (see FIG. 20), evidencing the aforementioned analysis. Examination of the XRD pattern and absorption spectra confirms that g-CN films on FTO glass, ITO glass, and silica have similar structures and optical properties (see FIG. 22).

In contrast, the diffraction peak in the XRD pattern of the g-CN film grown on quartz glass shifts to a smaller degree compared with the diffraction peaks of the g-CN films on FTO, ITO, and silica, thus indicating an increase in interlayer distance. The mismatch of the lattice constant between the C—N bonds π and the Sn—O, In—O, and Si—O bonds of FTO, ITO, and silica, respectively, may lead to a different orientation of the tri-s-triazine units. This may change the order of constituent units and the growth rate, leading to different g-CN film microstructures and thicknesses, and thus to a different energy-level configuration. Hence, g-CN films formed on different substrates exhibit different emission properties including the emission-peak position, PL QY, and the relative intensity of PL peaks. The absolute PL QYs of g-CN films grown on ITO glass, quartz glass and silica were 3.6%, 2.0%, and 0.3%, respectively, which are all lower values than that of the g-CN film grown on FTO glass (6%).

Example 2D

Photoelectrochemical Performance of the g-CN Films

The photoelectrochemical (PEC) properties of the g-CN films were measured in a commercialized PEC cell. The g-CN films were cut to small pieces and the edges of the films were sealed by epoxy resin before measurement. The photoresponses of the films were recorded on a three-electrode electrochemical workstation (CHI 760E), in which the g-CN film, Pt sheet, and Ag/AgCl electrode (filled with saturated KCl at 20° C., 4.6 M) were used as the working, counter, and reference electrodes, respectively. The potentials versus Ag/AgCl were converted to those versus RHE according to the Nernst equation ($E_{RHE} = E_{Ag/AgCl} + 0.059$ pH+0.197). Unless stated otherwise, the electrolyte used in the experiment contained 0.1 M $Na_2SO_4$ (Alfa), 0.1 M $Na_2SO_3$ (Alfa) and 0.01 M $Na_2S$ (pH=11.6). The electrolyte was purged with $N_2$ for 0.5 h before measurement. The electrochemical impedance spectra (EIS) were recorded in the dark and under light at 0.5 V in the frequency region of $0.1-10^5$ Hz with AC voltage of 10 mV. A Xe lamp (NewBet) with AM 1.5 filter (100 mW/$cm^2$) was used as the light source. To measure the incident photon conversion efficiency (IPCE), the light from the Xe lamp was irradiated through a monochromator to generate monochromatic light, and the light intensity was measured using an illuminometer.

Figure 23A:
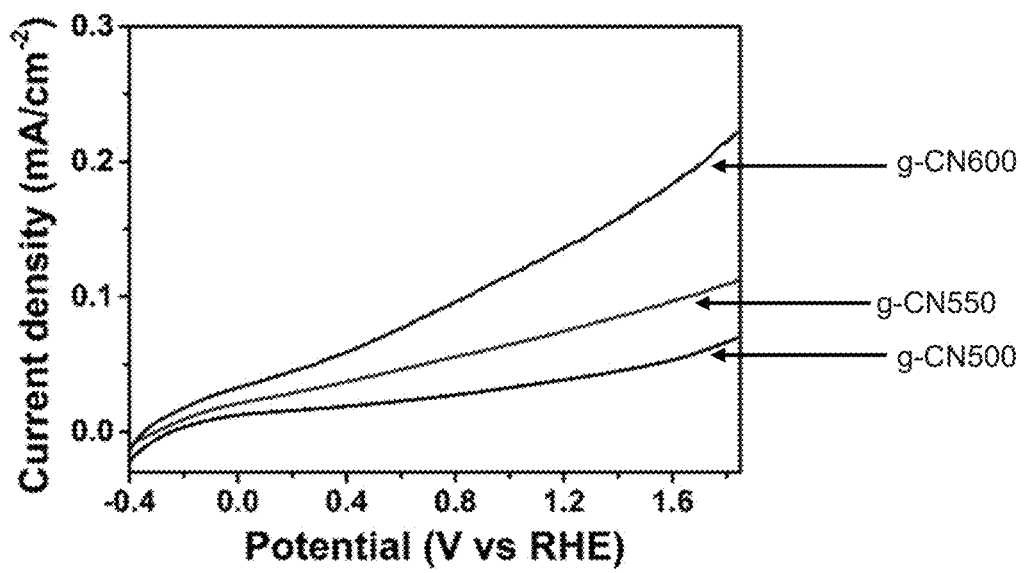
FIG. 23A shows LSV curves of the g-CN films processed under different temperatures.
Figure 23B:
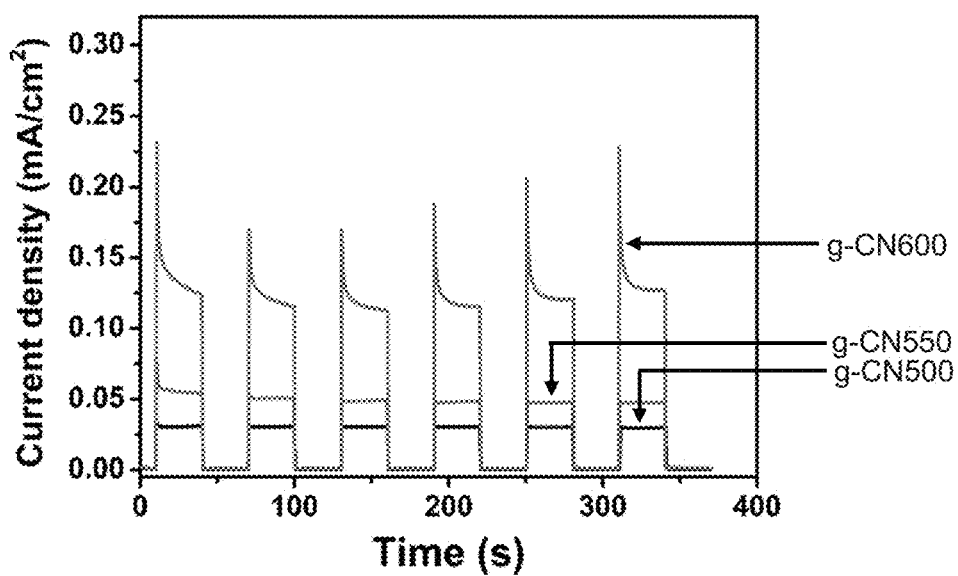
FIG. 23B shows transient photocurrent density of the g-CN films processed under different temperatures.
Figure 24:
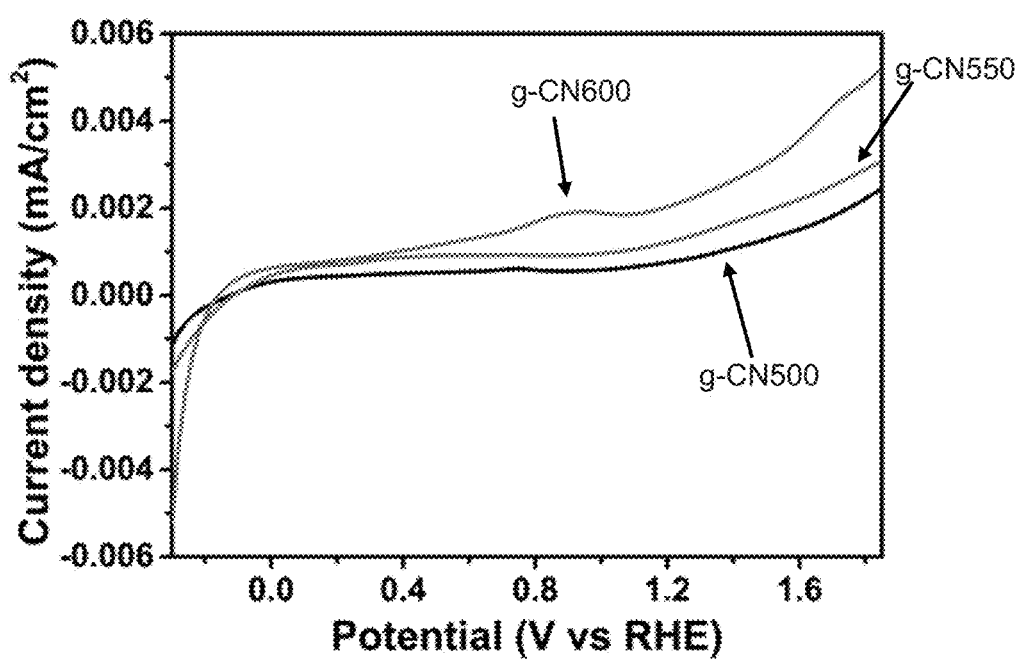
FIG. 24 shows a linear sweep voltammogram of g-CN films processed under different temperatures in the dark.

To facilitate the description, the g-CN films processed under 500° C., 550° C., and 600° C. are referred herein as g-CN500, g-CN550, and g-CN600, respectively. FIG. 23A depicts the linear sweep voltammograms (LSV) of g-CN films processed by different temperatures under light illumination. It is obvious that the photocurrent density is improved at any external bias with the elevated temperature. In comparison, the current density of the g-CN films in dark is only several μA/$cm^2$, much lower than the photocurrent density, as shown in FIG. 24. The transient current density under the chopped light illumination is shown in FIG. 23B. It is found that the g-CN films exhibit good photoresponse.

The photocurrent density is largely enhanced with the increase of the process temperature. The photocurrent density of g-CN600 is stabilized at 0.12 mA/$cm^2$ under the bias of 1.35 V (vs RHE) with $Na_2S$ as the sacrificial reagent, which is the best performance among the literatures. To date, g-CN based photoanodes are rarely documented, especially under AM 1.5 illumination. Reported photocurrent densities of g-CN films derived from g-CN powder are always less than 10 μA/$cm^2$. The photocurrent density of g-CN600 is 2.5 times of that of g-CN550 and 4 times of that of g-CN500. One of the reasons for the improved photoresponse is due to the enhanced light absorption in the visible range. From FIG. 23B, different charge transfer process can be observed. For g-CN500 and g-CN550, the relatively smooth transient photocurrents indicate the balanced photo-charge generation and charge transport process. Particularly, for g-CN600, a large transient photocurrent density is generated when light is on. Then the decay in the photocurrent density is observed. The reason having for this characteristic is that the electrons cannot travel to the FTO film in time and hence accumulate in the g-CN film. As a result, the excess electron-hole pairs recombine, leading to the decay of the photocurrent density. Once the balance among the charge carrier generation, separation, transport and recombination is achieved, the photocurrent density becomes stable.

Figure 23C:
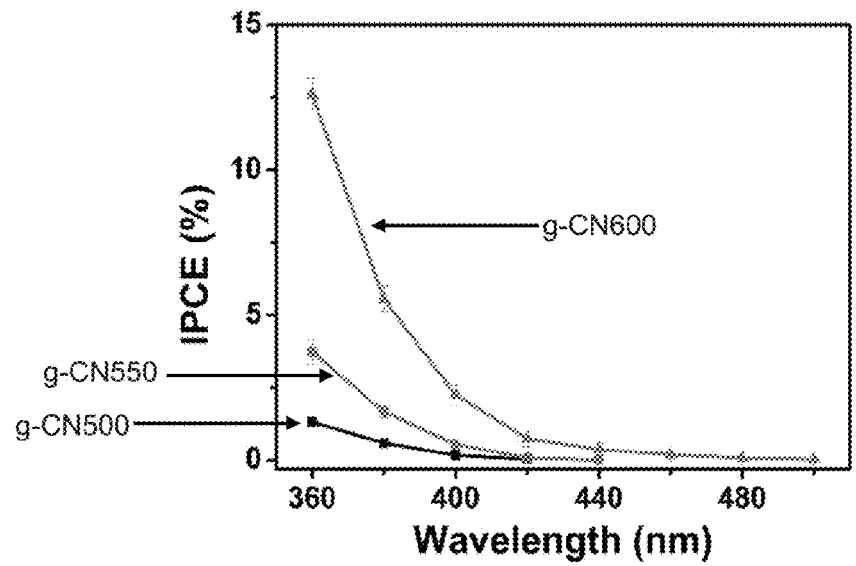
FIG. 23C shows IPCE curves of the g-CN films processed under different temperatures.

IPCE values of the g-CN films were measured to examine the photocurrent density as a function of the incident light wavelength. Calculation of the IPCE was based on the following equation:

$$IPCE = (1240I)/(\lambda J_{light})$$

where $I$, $\lambda$, and $J_{light}$ represent the photocurrent density, wavelength of incident light, and incident light power, respectively. Evidently, the IPCE values increase with the elevation of the process temperature, as shown in FIG. 23C.

Figure 23D:
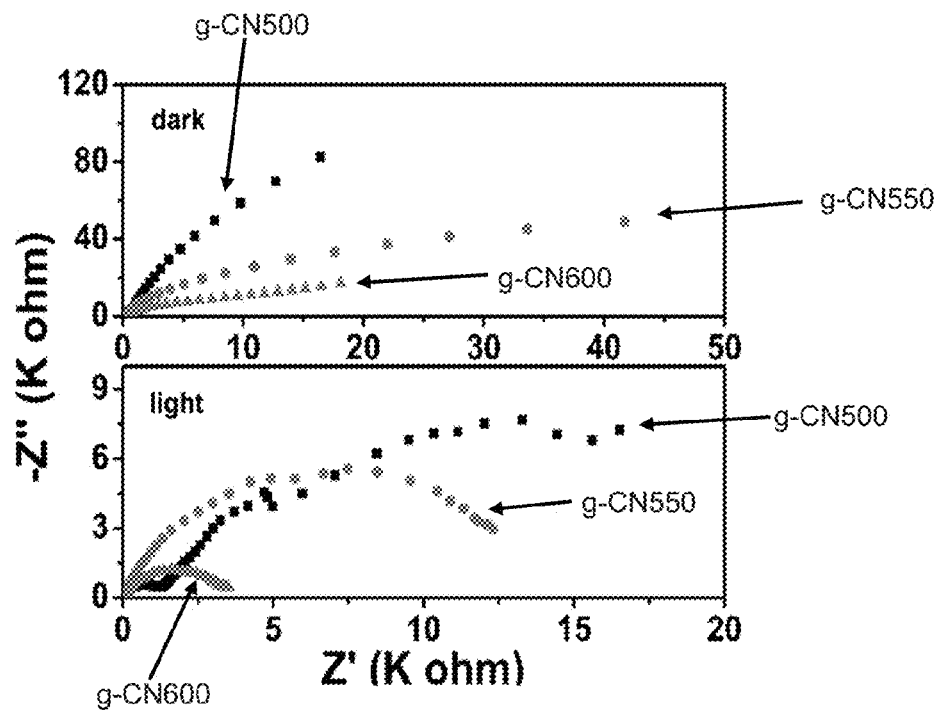
FIG. 23D shows EIS spectra of the g-CN films processed under different temperatures.

The EIS is a powerful means of characterizing charge transport properties between the photoelectrode and the electrolyte. The diameter of the semicircle in the Nyquist plots at the lower frequency represents the charge transfer resistance from the photoelectrode to the electrolyte. It can be seen from FIG. 23D that the diameter of the plots decreases as the process temperature increases, no matter under light or in dark conditions, indicating the lowered charge transfer resistance at the g-CN/electrolyte interface. This is due to the upshift of the energy levels, which increases the overpotential for charge transfer. The onset potentials for g-CN500, g-CN550 and g-CN600 are −0.24 V, −0.27 V and −0.35 V (vs RHE) (FIG. 23A), respectively, which is well consistent with the Nyquist plots. Moreover, the small semicircle at higher frequency represents the charge transport resistance in the g-CN films. The diameter of it decreases when the process temperature is higher than 550° C. That means the resistance in the g-CN films for charge transport is also improved. The reduced charge transport resistance is attributed to the enhanced thermal condensation degree of the film as more tri-s-triazine units are linked. Although the impedance of g-CN600 is lower than those of g-CN500 and g-CN550, the resistance for charge transport is still very large in g-CN600. Hence, the recombination of charge carriers in g-CN600 is still high, leading to the decay of the photocurrent density in the initial stage of the light illumination. Based on the aforementioned analysis, the good photoresponse of the g-CN600 is ascribed to the enhanced light absorption, reduced charge transport and charge transfer resistance.

Example 3

Subjecting g-CN Films to Ambient Condition

After storage in air for two weeks, the g-CN films on ITO glass and quartz glass were peeled off from the substrates, whereas the films on FTO glass and silica were stably attached on the substrates after two years. The firm attachment of the g-CN films on the substrates may be due to that non-bonded N atoms on adjacent structure units generate a destabilizing strain, owing to the repulsion force of the lone-pair electrons of the N atoms. Accordingly, it results in corrugation of the g-CN. The textured surface of the FTO glass largely matches the corrugation of the g-CN and releases strain. The stability of g-CN film on silica indicates that the ordered Si—O surface may have strong interactions with the g-CN film. In view of the results, FTO glass provides a more stable substrate surface for depositing g-CN films.

It will be appreciated a number of alternative embodiments have been described herein. It will be appreciated by persons skilled in the art that the alternative embodiments described can be used in part or wholly with any of the embodiments described with reference to the figures. It will also be appreciated that portions or elements that are known in the prior art or known to persons skilled in the art have not been explicitly described.

It will be appreciated by persons skilled in the art that numerous variations and/or modifications may be made to the invention as shown in the specific embodiments without departing from the spirit or scope of the invention as broadly described. The present embodiments are, therefore, to be considered in all respects as illustrative and not restrictive.

The invention claimed is:

1. A method of forming a semiconductor film in the presence of a substrate, wherein the semiconductor film comprises a tri-s-triazine unit, the method comprising the steps of:

(i) providing a precursor material in a reaction container, wherein the precursor material is an organic material consisting of melamine;

(ii) arranging the substrate on the reaction container such that a conductive surface of the substrate is facing towards the precursor material; and (iii) conducting a heat treatment to deposit a semiconductor layer on the conductive surface of the substrate, where the method is devoid of the use of a vacuum system.

2. The method of claim 1, wherein the precursor material is in the form of powder.

3. The method of claim 1, wherein step (iii) is carried out by heating the precursor material with a temperature at or above a melting point or a sublimation point of the precursor material for a predetermined period of time.

4. The method of claim 1, wherein step (iii) is carried out with a predetermined heating rate of about 0.1-100° C./min and a predetermined cooling rate of about 0.1-100° C./min.

5. The method of claim 3, wherein step (iii) is carried out by heating the precursor material with a temperature above the sublimation point, in which the precursor material forms vapors and the vapors saturate the reaction container.

6. The method of claim 5, wherein step (iii) further includes a condensing step of condensing the vapors on the conductive surface of the substrate.

7. The method of claim 5, wherein the precursor material has a sublimation point of about 0° C. to about 600° C.

8. The method of claim 1, wherein the semiconductor film comprises graphitic carbon nitride.

9. The method of claim 1, wherein the substrate is selected from the group consisting of fluorine doped tin oxide coated glass, indium tin oxide coated glass and silicon.

* * * * *